(12) United States Patent
Jeong et al.

(10) Patent No.: US 11,510,336 B2
(45) Date of Patent: Nov. 22, 2022

(54) ELECTRONIC DEVICE HAVING HEAT DISSIPATION FUNCTION

(71) Applicant: LG ELECTRONICS INC., Seoul (KR)

(72) Inventors: MinWoo Jeong, Seoul (KR); Chun Hyuk Ryu, Seoul (KR); Jongkil Shin, Seoul (KR); BongJun Kim, Seoul (KR); Minjae Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 26 days.

(21) Appl. No.: 16/934,373

(22) Filed: Jul. 21, 2020

(65) Prior Publication Data
US 2021/0076533 A1 Mar. 11, 2021

(30) Foreign Application Priority Data
Sep. 10, 2019 (KR) .................. 10-2019-0112377

(51) Int. Cl.
*H05K 7/20* (2006.01)
*F28F 13/16* (2006.01)
(Continued)

(52) U.S. Cl.
CPC ......... *H05K 7/20009* (2013.01); *F28F 13/16* (2013.01); *H01L 23/467* (2013.01);
(Continued)

(58) Field of Classification Search
CPC ........... H05K 7/20135; H05K 7/20154; H05K 7/20436–20445; H01L 23/367; H01L 23/3733; H01L 23/467; F28F 13/16
See application file for complete search history.

(56) References Cited

U.S. PATENT DOCUMENTS 5,353,193 A * 10/1994 Chia ..................... F02F 7/00
165/185
6,522,536 B2 * 2/2003 Brewer .................... G06F 1/20
165/80.3
(Continued)

FOREIGN PATENT DOCUMENTS

CN 106612608 B * 5/2019
JP S59229188 A * 12/1984
(Continued)

OTHER PUBLICATIONS

European Search Report dated Feb. 2, 2021 issued in Application No. 20186454.3.

*Primary Examiner* — Robert J Hoffberg
(74) *Attorney, Agent, or Firm* — KED & Associates, LLP

(57) ABSTRACT

An electronic device having heat dissipation function is proposed. The electronic device includes: a heating element (60) installed in a casing (C); a heat dissipation means (70) causing an ionic wind to flow into an inner space (S) of the casing (C); and a heat dissipation bridge (95). The heat dissipation bridge (95) exchanges heat with the ionic wind flowing in the inner space (S) by protruding in a direction of the heating element (60) and at least a portion of the heat dissipation bridge is connected to a heat sink and transfers heat received from the heating element (60) to the heat sink. Accordingly, two means of the heat dissipation means (70) and the heat dissipation bridge (95) simultaneously cool the heating element (60), so cooling efficiency is improved.

14 Claims, 9 Drawing Sheets

(51) Int. Cl.
*H01L 23/467* (2006.01)
*H01L 23/367* (2006.01)
*H01L 23/373* (2006.01)

(52) U.S. Cl.
CPC ........ H05K 7/20154 (2013.01); H01L 23/367 (2013.01); H01L 23/3733 (2013.01); H05K 7/20409 (2013.01)

(56) References Cited

U.S. PATENT DOCUMENTS

| | | | | |
|---|---|---|---|---|
| 7,760,506 | B1 * | 7/2010 | Wang | H05K 7/20727 361/679.48 |
| 8,305,728 | B2 * | 11/2012 | Lee | H01L 23/467 361/231 |
| 8,342,234 | B2 * | 1/2013 | Ouyang | H01L 23/427 165/83 |
| 8,482,898 | B2 * | 7/2013 | Honer | B03C 3/743 361/225 |
| 8,545,599 | B2 * | 10/2013 | Humpston | G03G 21/206 95/59 |
| 2008/0060794 | A1 * | 3/2008 | Wei | F21V 29/63 165/109.1 |
| 2008/0302514 | A1 * | 12/2008 | Ouyang | F28F 13/16 165/104.33 |
| 2010/0177519 | A1 * | 7/2010 | Schlitz | F21V 29/763 362/294 |
| 2011/0037367 | A1 * | 2/2011 | Wang | F21V 29/63 313/46 |
| 2011/0110041 | A1 * | 5/2011 | Wong | H05K 7/20445 361/690 |
| 2011/0139401 | A1 * | 6/2011 | Huang | H05K 7/20172 165/96 |
| 2011/0308773 | A1 * | 12/2011 | Gao | B03C 3/743 165/104.34 |
| 2011/0308775 | A1 | 12/2011 | Honer | |
| 2012/0007742 | A1 * | 1/2012 | Gooch | H01T 23/00 340/584 |
| 2013/0153199 | A1 * | 6/2013 | Busch | H01L 23/467 165/287 |
| 2018/0172360 | A1 * | 6/2018 | Miura | F28D 15/0233 |
| 2021/0076534 | A1 * | 3/2021 | Park | F28F 13/16 |
| 2021/0091542 | A1 * | 3/2021 | Kim | H01T 23/00 |

FOREIGN PATENT DOCUMENTS

| | | |
|---|---|---|
| JP | 2000232287 A * | 8/2000 |
| JP | 2001-015969 | 1/2001 |
| JP | 2013-225701 | 10/2013 |
| KR | 10-1361667 | 2/2014 |
| KR | 10-2016-0128501 | 11/2016 |
| KR | 10-2018-0079693 | 7/2018 |
| KR | 20200114883 A * | 10/2020 |

* cited by examiner

ELECTRONIC DEVICE HAVING HEAT DISSIPATION FUNCTION

CROSS REFERENCE TO RELATED APPLICATION

The present application claims priority to Korean Patent Application No. 10-2019-0112377, filed Sep. 10, 2019, the entire contents of which is incorporated herein for all purposes by this reference.

BACKGROUND OF THE INVENTION

Field of the Invention

The present disclosure generally relates to an electronic device. More particularly, the present disclosure relates to an electronic device having a heat dissipation function, wherein an ionic wind is used to reduce the temperature of a heating element.

Description of the Related Art

In recent years, with the trend of miniaturization of electronic equipment, the integration density of an electronic device is increasing, and accordingly, heat generated from the electronic equipment is increased. When the heat is not sufficiently discharged to the outside, the performance and lifespan of the electronic equipment may be lowered and the deformation caused by the heat may cause the breakdown of the electronic equipment.

Recently, for example, telematics modules are installed inside a vehicle to use 5G communication service, which is next generation communication service. Such a communication module is installed inside the vehicle's roof to increase antenna performance. However, although the inside of the roof of the vehicle is easy to be heated by external heat, the inside of the roof is very narrow, so there is a problem that it is difficult to install therein a high-performance heat dissipation means such as a heat dissipation fan.

Recently, a heat dissipation means using an ionic wind has been developed to solve this problem. For example, there is an electronic device which performs heat dissipation by using an ionic wind generator and a heat sink, or a technology in which a heat dissipation device is implemented by using ion wind generation electrodes and radially arranged heat-dissipating fins.

However, the electronic device according to these technologies includes a heat sink (heat-dissipating fins) along with a discharge electrode (an emitter electrode) and a ground electrode (a collector electrode) to generate an ionic wind. Accordingly, miniaturization of the electronic device is not easy. In particular, the communication module described above is not only installed in a narrow place but also has a severe heat generating condition. Accordingly, the communication module is required to have a small size and high heat dissipation performance, but the ionic wind generator does not provide as much air volume as the air volume of a heat dissipation fan. Accordingly, it is difficult to implement a heat-dissipating device that satisfies all of these conditions.

DOCUMENTS OF RELATED ART (Patent Document 1) Korean Patent No. 10-1361667
(Patent Document 2) Korean Patent Application Publication No. 10-2018-0079693

SUMMARY OF THE INVENTION

Accordingly, the present disclosure has been made keeping in mind the above problems occurring in the related art, and an objective of the present disclosure is to realize the miniaturization of a heat dissipation means generating an ionic wind.

Another objective of the present disclosure is to achieve high heat dissipation performance in a narrow installation space by placing a heat dissipation bridge in a flow path of an ionic wind.

In order to achieve the above objectives, according to one aspect of the present disclosure, there is provided an electronic device having heat dissipation function, the electronic device including: a heating element installed in a casing; a heat dissipation means causing an ionic wind to flow into an inner space of the casing; and a heat dissipation bridge. The heat dissipation bridge exchanges heat with the ionic wind flowing in the inner space by protruding in a direction of the heating element and at least a portion of the heat dissipation bridge is connected to a heat sink and transfers heat received from the heating element to the heat sink. Accordingly, two means of the heat dissipation means and the heat dissipation bridge simultaneously cool the heating element, so cooling efficiency is improved.

A first end of the heat dissipation bridge may protrude in a direction of the heating element and a second end of the heat dissipation bridge at an opposite side of the first end may be directly connected to the heat sink. That is, the present disclosure does not use a separate cooling fan or a thick heat sink, but use a small ionic wind generator (the heat dissipation means) and the heat dissipation bridge protruding toward the heating element from the heat sink of a thin flat plate. The heating element may be cooled by convective heat transfer due to the ionic wind generated by the heat dissipation means and by heat conduction via the heat dissipation bridge. Accordingly, the cooling performance of components can be enhanced even inside the electronic device which has high thermal resistance but is very narrow and in which heat dissipation design is very difficult.

In addition, the heat dissipation bridge may be located in a flow path through which the ionic wind flows. Although the heat dissipation bridge receives heat directly from the heating element by being in contact therewith and performs a cooling function in a heat conduction method, the heat dissipation bridge exchanges heat with the ionic wind since the heat dissipation bridge protrudes to the flow path through which the ionic wind flows.

One end of the heat dissipation bridge may be in direct contact with a surface of the heating element or with a surface of a shield covering the heating element. Accordingly, the present disclosure may be applied even to a structure poor in heat dissipation in which the heating element generating high temperature as a communication module is provided and the heating element is required to be covered by the shield to block electromagnetic waves.

Furthermore, a heat exchange part may be provided on a surface of the heat dissipation bridge and increase a surface area of the heat dissipation bridge. The heat exchange part may have a shape of a ring surrounding the surface of the heat dissipation bridge and protruding therefrom or have a shape of a protrusion protruding from the surface of the heat dissipation bridge. Such a heat exchange part may increase the surface area of the heat dissipation bridge and further increase the heat exchange area of the heat dissipation bridge with the ionic wind.

In addition, the heat dissipation means may include a module housing provided in the casing, the module housing having an installation space which is open to opposite sides thereof, wherein the wire electrode may be installed at an entrance of the installation space and the counter electrode may be installed at an exit of the installation space. Accordingly, the heat dissipation means may be made in a modular form and may be independently installed at an entrance of the casing, and the heat dissipation bridge may also be attached to the existing heat sink to be implemented. Therefore, the present disclosure may be applied without significantly changing a conventional electronic device design.

In addition, the inner space, in which the heating element is installed, may be provided in the casing; the heat dissipation means may be installed at a position adjacent to an open inlet at a side of the inner space; an open outlet may be provided at a position corresponding to a side opposite to the side of the inlet relative to the heating element in the casing. Accordingly, the ionic wind may naturally pass through the inner space and be discharged to the outside, which causes no noise and vibration compared to the cooling fan powered by a motor.

The electronic device having heat dissipation function of the present disclosure as described above has the following effects.

In the present disclosure, the heat dissipation means cools the heating element of the electronic device by generating an ionic wind, and the heat dissipation bridge directly receives heat generated by the heating element and discharges the heat through the heat sink to the outside. Accordingly, since two means of the heat dissipation means and the heat dissipation bridge simultaneously cool the heating element, the cooling efficiency is significantly improved.

In particular, the present disclosure does not use a separate cooling fan or a thick heat sink, but a small ionic wind generator (the heat dissipation means) and the heat dissipation bridge protruding toward the heating element from the heat sink of a thin flat plate. The heating element can be cooled by convective heat transfer due to the ionic wind generated by the heat dissipation means and by heat conduction via the heat dissipation bridge. Accordingly, the cooling performance of components can be enhanced even inside the electronic device which has high thermal resistance but is very narrow and in which heat dissipation design is very difficult.

In addition, although the heat dissipation bridge receives heat directly by being in contact with the heating element and performs a cooling function in a heat conduction method, the heat dissipation bridge also exchanges heat with the ionic wind since the heat dissipation bridge protrudes to the flow path through which the ionic wind flows. Accordingly, the surface area of a heating unit (the heating element and the heat dissipation bridge) that exchanges heat with the ionic wind is increased, and the convective heat transfer efficiency is improved.

Particularly, the heat exchange part (a heat dissipation protrusion part or a heat dissipation groove) on the surface of the heat dissipation bridge increases the surface area of the heat dissipation bridge and further increases the heat exchange area of the heat dissipation bridge with the ionic wind. Such a structure increases the heat exchange surface area without increasing the number and size of the heat dissipation bridge, thereby improving heat dissipation efficiency.

In addition, the heat dissipation bridge of the present disclosure may perform a heat conduction function by being in contact with a shield can covering the heating element. Accordingly, the present disclosure can be applied even to a structure poor in heat dissipation in which the heating element generating high temperature as a communication module is provided and the heating element is required to be covered by the shield can to block electromagnetic waves. As a result, product performance and durability are improved.

Furthermore, the heat dissipation means of the present disclosure is manufactured in a modular form and includes the wire electrode and the counter electrode. Accordingly, the heat dissipation means may be independently installed at the entrance of the casing. The heat dissipation bridge may also be attached to the existing heat sink to be implemented. Therefore, the present disclosure can be applied without significantly changing a conventional electronic device design, thereby having a high degree of compatibility and design freedom.

In addition, the present disclosure cools the heating element by using the ionic wind generated by the wire electrode and a collector electrode (the shield can), which causes no noise and vibration as compared to a cooling fan operated by a motor. Accordingly, the present disclosure can be applied to various electronic devices requiring low noise/vibration.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION OF THE INVENTION

Figure 1:
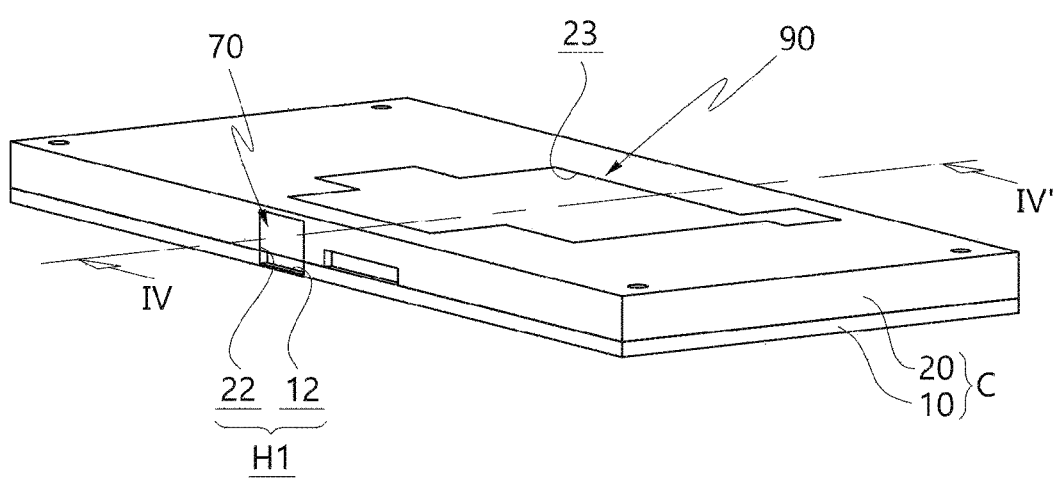
FIG. 1 is a perspective view illustrating a first embodiment of an electronic device having heat dissipation function according to the present disclosure.

Hereinbelow, some embodiments of present disclosure will be described in detail with reference to the accompanying drawings. In adding reference numerals to the components of each drawing, it should be noted that the same reference numerals are assigned to the same components as much as possible even though they are shown in different drawings. In addition, in describing the embodiments of the present disclosure, detailed descriptions of related known configurations or functions are omitted when it is determined that the understanding of the embodiments of the present disclosure is disturbed.

In addition, in describing the components of the embodiments of the present disclosure, terms such as first, second, A, B, a, and b may be used. These terms are only to distinguish the components from other components, and the nature or order, etc. of the components is not limited by the terms. When a component is described as being "connected", "coupled", or "joined" to other components, that component may be directly connected or joined to the other components, and it will be understood that other components between each component may be "connected", "coupled", or "joined" to each other.

The present disclosure relates to an electronic device having heat dissipation function (hereinafter, referred to as "an electronic device"). The present disclosure may be applied to a structure poor in heat dissipation because of being installed in narrow space although having a heating element 60 generating much heat such that the structure implements high heat dissipation performance. To this end, the electronic device of the present disclosure generates an ionic wind by using a heat dissipation means 70 and includes a heat dissipation bridge 95 capable of enhancing the convective heat transfer effect of the heat dissipation means 70 and of directly discharging heat in a heat conduction method.

Here, the ionic wind uses the movements of ions occurring during corona discharge. The ions generated by a discharge electrode are moved from an emitter electrode (the discharge electrode) to a collector electrode (a ground electrode) by an electric field between the electrodes, that is, by coulomb force. The ions moving in this manner move air molecules in the same direction via the collision with the air molecules, and the movements of the air molecules are joined together and are finally used as a blowing force.

Hereinbelow, the specific structure of the present disclosure will be described by focusing on the heat dissipation means 70 and the heat dissipation bridge 95, the heat dissipation means 70 being configured to generate the ionic wind.

Figure 2:
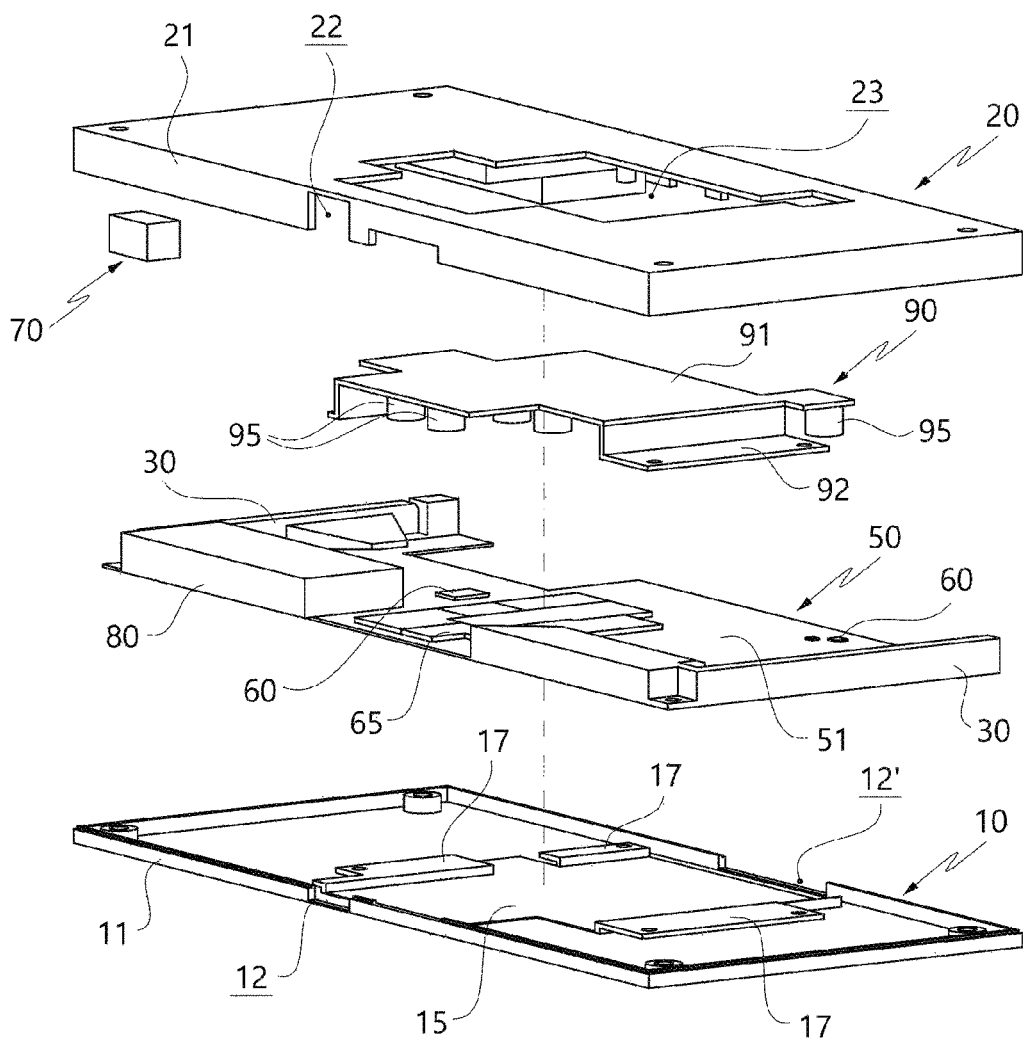
FIG. 2 is an exploded perspective view illustrating components constituting the electronic device according to the first embodiment illustrated in FIG. 1.

FIG. 1 is a perspective view illustrating a first embodiment of an electronic device having heat dissipation function according to the present disclosure, and FIG. 2 is an exploded perspective view illustrating components constituting the electronic device according to the first embodiment illustrated in FIG. 1.

As illustrated in FIGS. 1 and 2, a casing C constitutes an outer surface and framework of the electronic device. The casing C may be made of a metal or nonmetallic material and includes an inner space S which is empty (see FIG. 4) therein. A circuit board 50, the heat dissipation means 70, and the heating element 60, which will be described hereinbelow, are installed in the inner space S. In the embodiment, the casing C has a closed shape, but may have an open shape in a portion thereof.

The casing C includes a lower casing 10 and an upper casing 20. When the lower casing 10 is assembled with the upper casing 20, the inner space S is defined therebetween. In the embodiment, each of the lower casing 10 and the upper casing 20 has a roughly rectangular shape, but the shape thereof may be changed variously. The casing C is made to be thin with a height of a size smaller than a size of a left to right width, so the height of the inner space S is also low. Accordingly, the inner space S of the casing C is in a condition in which temperature therein is easily increased when heat generated by the heating element 60 is not discharged.

A lower fence 11 is provided on a side surface of the lower casing 10 by surrounding edges thereof and protrudes toward the upper casing 20. The lower fence 11 has a lower inlet 12 that is partially open. The lower inlet 12 is made by decreasing a height of a portion of the lower fence 11, or by disconnecting a middle of the lower fence 11. The lower inlet 12 corresponds to an inlet connecting the inner space S to the outside, and defines an inlet H1 in cooperation with an upper inlet 22, which will be described below. The heat dissipation means 70 is installed in the inlet.

A lower outlet 12' is provided in the lower fence 11 located at a side opposite to a side of the lower inlet 12. Like the lower inlet 12, the lower outlet 12' is made by decreasing a height of a portion of the lower fence 11, or by disconnecting a middle of the lower fence 11. The lower outlet 12' corresponds to an exit connecting the inner space S to the outside, and defines one outlet H2 in cooperation with an upper outlet 22', which will be described below. Air in the inner space may be discharged through the outlet H2 to the outside.

A first heat sink 15 is installed in the lower casing 10. The first heat sink 15 is made of a thin metal plate, and is installed to face the circuit board 50. The first heat sink 15 functions to discharge heat generated by the circuit board 50 including the heating element 60 to the outside. To this end, the first heat sink 15 is made of a highly conductive metal. Although not shown, a lower heat dissipation window is provided in the lower casing 10 to be open such that a portion of the surface of the first heat sink 15 is exposed to the outside. A reference numeral 17 is a part bent from the first heat sink 15 and refers to an assembly part assembled with a lower surface of the circuit board 50. For reference, the first heat sink 15 may be omitted.

The upper casing 20 is assembled with the lower casing 10. Like the lower casing 10, the upper casing 20 has an approximately rectangular shape and includes an upper fence 21 surrounding edges thereof. The upper fence 21 defines a side surface of the casing C by being in close contact with the lower fence 11. The upper fence 21 has the upper inlet 22 provided by opening a portion of the upper fence 21. The upper inlet 22 is made by decreasing a height of a portion of the upper fence 21 or by disconnecting a middle of the upper fence 21. The upper inlet 22 corresponds to an entrance connecting the inner space S to the outside, and defines one inlet H1 in cooperation with the lower inlet 12. The heat dissipation means 70 is installed in the inlet.

The upper outlet 22' is provided in the upper fence 21 located at a side corresponding to an opposite side of the upper inlet 22. Like the upper inlet 22, the upper outlet 22' is made by lowering a height of a portion of the upper fence 21 or by disconnecting a middle of the upper fence 21. The upper outlet 22' corresponds to an exit connecting the inner space S to the outside, and defines one outlet H2 in cooperation with the lower outlet 12', wherein air in the inner space is discharged through the outlet H2 to the outside. In the embodiment, the outlet H2 is positioned at an opposite side of the inlet H1. However, the outlet may be located at a position which is not the opposite side of the inlet H1, or may be omitted.

An upper heat dissipation window 23 is provided in a middle of the upper casing 20. The upper heat dissipation window 23 is made by opening a portion of the middle of the upper casing 20, and an upper surface 91 which is at least a portion of an outer surface of a second heat sink 90 may be exposed through the upper heat dissipation window 23 to the outside. For easy description, the second heat sink 90 will be simply described first. The second heat sink 90 is installed at the opposite side of the first heat sink 15 relative to the circuit board 50, and functions to receive heat generated in the circuit board 50 including the heating element 60 and to discharge the heat to the outside. Like the first heat sink 15, the second heat sink 90 is made of a highly conductive metal.

Figure 4:
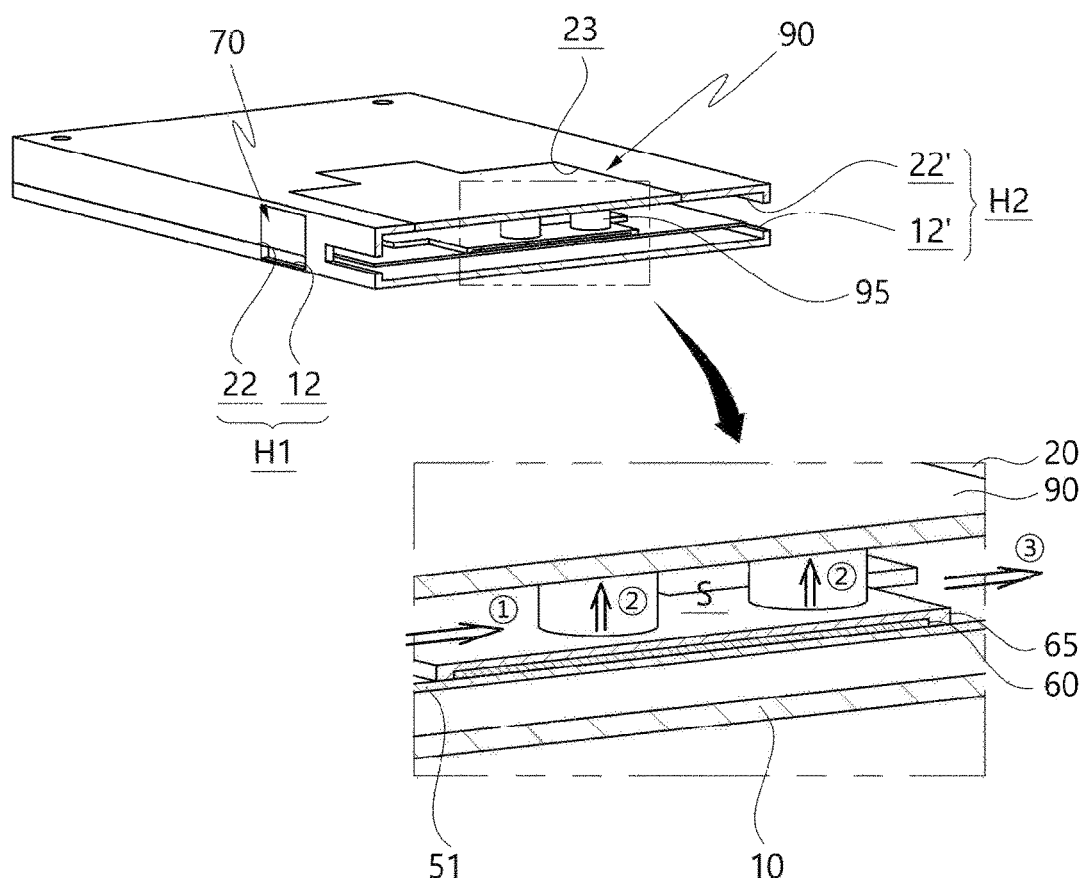
FIG. 4 is a sectional view taken along line IV-IV' of FIG. 1.

The circuit board 50 is installed in the inner space S of the casing C. Various components may be mounted to the circuit board 50, and when the electronic device is the communication module, other components including antennas may be added therein or connected thereto. The heating element 60 is mounted to the upper surface 51 of the circuit board 50, and a shield 65 is provided to cover the heating element 60. Referring to FIGS. 2 and 4, the shield 65 covers the heating element 60. The entirety of the shield 65 covers only a portion of the heating element 60 and the remaining portion of the heating element 60 may be exposed to the outside without being covered by the shield 65. Here, the shield 65 as a shield may block electromagnetic waves.

Here, the heating element 60 may be regarded as including the circuit board 50. Since the circuit board 50 itself may generate heat during use of the electronic device, the circuit board 50 may also be a part of the heating element 60. Of course, only various electrical components installed on the circuit board 50 may be viewed as the heating element 60, and both the circuit board 50 and the electrical components may be viewed as the heating element 60. A reference numeral 30, which is not described, refers to a side block, in which the circuit board 50 is installed, and is a part of components constituting the framework of the electronic device, and may be omitted.

The heat dissipation means 70 is installed in the casing C. The heat dissipation means 70 is installed in the casing C to be adjacent to the heating element 60 and functions to flow the ionic wind to the inner space S in which the heating element 60 is installed. The heat dissipation means 70 is installed in the inlet H1 of the casing C, and flows the ionic wind to the inner space S, so that the ionic wind passes up to the shield 65. In the process, the heating element 60 may be cooled.

As will be described again hereinbelow, the heat dissipation means 70 includes a power module 80, a wire electrode 75, and a counter electrode 77. The wire electrode 75 is connected to the power module 80 and receives power from the power module 80, and becomes the emitter electrode. The counter electrode 77 is spaced apart from the wire electrode 75 in a direction closer to the heating element 60 and is grounded at the same time of being connected to the power module 80 to become the collector electrode.

Figure 3:
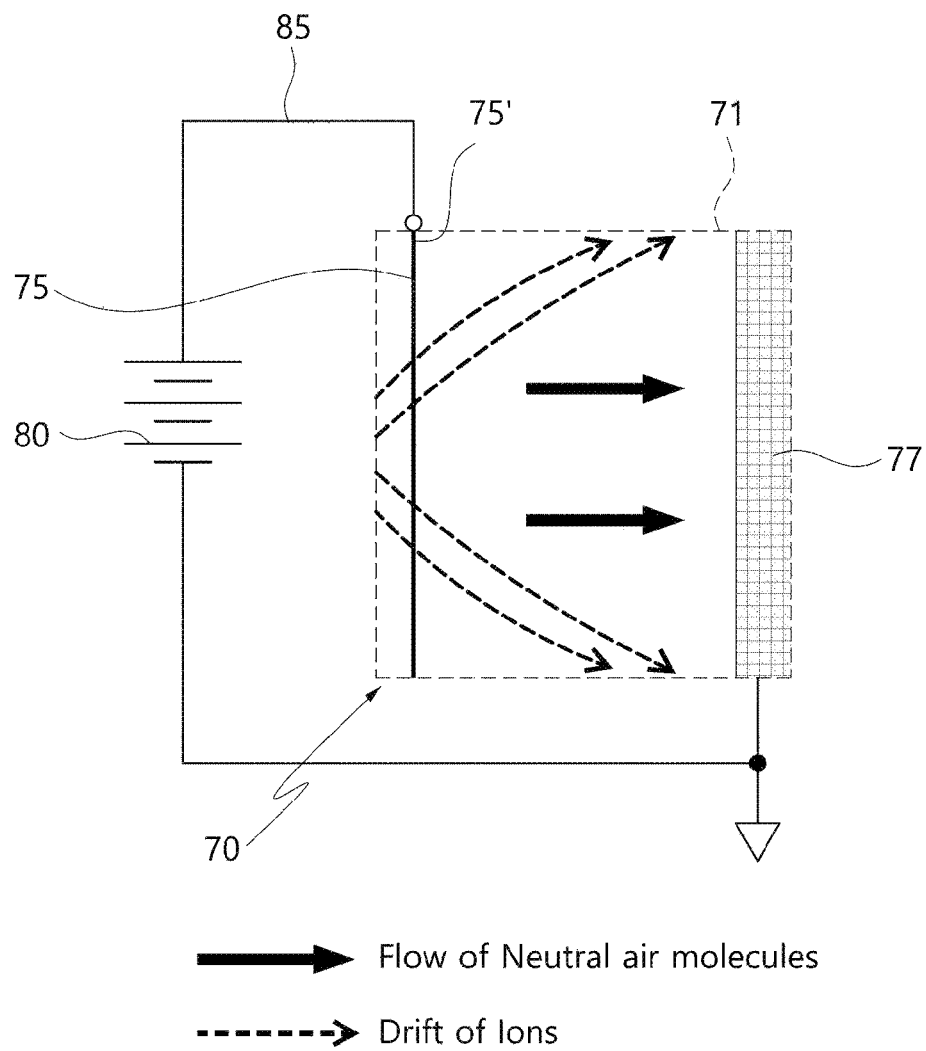
FIG. 3 is a conceptual diagram illustrating circuit configuration for generating an ionic wind in the first embodiment illustrated in FIG. 1.

FIG. 3 illustrates a circuit configuration for generating the ionic wind. As illustrated in FIG. 3, the power module 80 generates a high voltage direct current and functions to receive external power and supply the power to the wire electrode 75. In the embodiment, the power module 80 is installed at a side of the circuit board 50 and generates the voltage of 5 kv, and the magnitude of the voltage may change. For reference, in FIG. 3, a module housing 71 constituting the heat dissipation means 70 is indicated with a dotted line.

The wire electrode 75 and the counter electrode 77 are connected to the power module 80. In the embodiment, the wire electrode 75 is connected to a positive electrode of the power module 80, and the counter electrode 77 is connected to a negative electrode thereof. Furthermore, the counter electrode 77 is grounded through the circuit board 50. Here, the two electrodes may be reversed and the wire electrode 75 may be the negative electrode. However, when the wire electrode 75 is the negative electrode, ozone generation concentration by corona discharge increases and efficiency is low. Accordingly, the wire electrode is preferably the positive electrode. In this case, a connection wire 85 is provided between the power module 80 and the wire electrode 75, and the power module 80 may be electrically connected to the wire electrode 75.

In this connected state, when a high voltage direct current is applied to the wire electrode 75 by the power module 80, the wire electrode 75 becomes the emitter electrode and the counter electrode 77 becomes the collector electrode, so that the ionic wind is generated. More particularly, ions generated in the wire electrode 75 by corona discharge are moved from the emitter electrode (the wire electrode 75) to the ground electrode (the counter electrode 77) by an electric field between the electrodes, that is, by coulomb force. The ions moving in this manner move air molecules in the same direction via the collision with the air molecules, and the movements of the moving air molecules are joined together and finally generate a blowing force.

Accordingly, in the present disclosure, the wire electrode 75, the counter electrode 77 and the power module 80 constitute the heat dissipation means 70, wherein the heat dissipation means 70 functions to cool the heating element 60 positioned in the inner space S by generating the ionic wind. In the embodiment, the heat dissipation means 70 allows the heat dissipation bridge 95 protruding in the direction of the heating element 60 to perform the heat exchange and cools the heat dissipation bridge 95. Thus when the heat dissipation means 70 of the present disclosure is installed on one side of the casing C and the power module 80 is mounted to the circuit board 50, the heat dissipation means can be implemented. Accordingly, the heat dissipation means can be applied to a conventional electronic device without significantly changing the design of the conventional electronic device.

Figure 5:
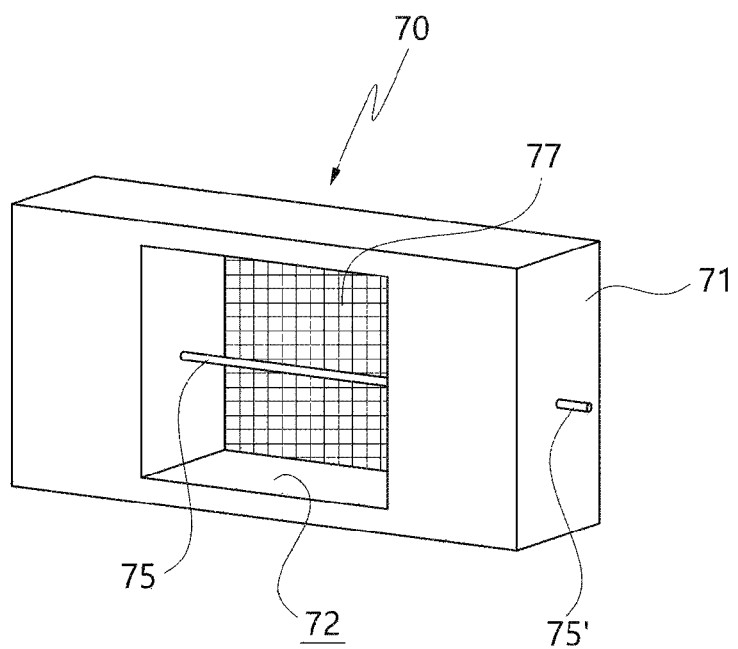
FIG. 5 is a perspective view illustrating a structure of a heat dissipation means constituting the electronic device according to the first embodiment of FIG. 1.

FIG. 5 illustrates the configuration of the heat dissipation means 70. Referring to FIG. 5, the heat dissipation means 70 includes the module housing 71 installed in the casing C. The module housing 71 constitutes the framework of the heat dissipation means 70 and in the embodiment, is a kind of housing of an approximately hexagonal shape. The module housing 71 is made of an insulating material such as synthetic resin. An installation space 72 having open opposite sides is provided in a middle of the module housing 71, wherein the wire electrode 75 is installed at an entrance of the installation space 72 and the counter electrode 77 is installed at an exit of the installation space 72.

The installation space 72 has an approximately rectangular shape, and the entrance thereof faces an outer side of the casing C, and the exit thereof faces the inner space S, that is, the heating element 60. The installation space 72 provides a space in which the wire electrode 75 and the counter electrode 77 can be installed, and further secures a separation distance of the wire electrode 75 and the counter electrode 77 from each other. More particularly, a width direction of the installation space 72, that is, the distance from the entrance to the exit allows the wire electrode 75 and the counter electrode 77 to be spaced apart from each other.

The wire electrode 75 is installed in the installation space 72 of the module housing 71 in a direction crossing the entrance of the installation space 72. As illustrated in FIG. 5, the wire electrode 75 is installed by crossing the entrance of the installation space 72 from left to right, and an end 75' of the wire electrode protrudes to an outer side of the module housing 71. The protruding end 75' may be electrically connected to the power module 80 by the connection wire 85. In the embodiment, the wire electrode is installed in the left to right direction of the entrance of the installation space 72. However, the wire electrode may be installed in an upward/downward direction orthogonal to the left to right direction, and be installed in plural.

The wire electrode 75 may be installed at a side inner than the side of the entrance of the installation space 72. Since the wire electrode 75 is powered, the wire electrode may be installed in the installation space 72 for safety. In this embodiment, the wire electrode 75 is installed at the center of the installation space 72.

The counter electrode 77 is installed to be spaced apart from the wire electrode 75 and toward an outlet of the installation space 72, i.e. toward the inner space S. The counter electrode 77 is connected to the power module 80 and grounded through the circuit board 50 to become the ground electrode. The counter electrode 77 may be implemented in various structures. In the present embodiment, the counter electrode 77 has a metal mesh network structure. In contrast, the counter electrode 77 as a thin metal plate may be installed in the inner surface of the installation space 72 and be changed variously.

Meanwhile, the heat dissipation means 70 may be mounted directly to the casing C without a separate module housing 71. For example, the wire electrode 75 and the counter electrode 77 may be installed at the inlet H1 of the casing C, or the wire electrode 75 and the counter electrode 77 may be installed at the inner space S. In addition, the heat dissipation means 70 may be directly mounted to the circuit board 50, so without the connection wire 85, the wire electrode 75 may be connected to the power module 80 by a pattern of the circuit board 50, and the counter electrode 77 may also be connected to the power module 80 by the pattern on the circuit board 50 and grounded at the same time.

Referring to FIG. 2 again, the heat dissipation bridge 95 is provided in the second heat sink 90. The heat dissipation bridge 95 protrudes in the direction of the heating element 60 and exchanges heat with the flowing ionic wind. At the same time, at least a portion of the heat dissipation bridge is connected to the second heat sink 90 and transfers the heat received from the heating element 60 to the second heat sink 90. To this end, the heat dissipation bridge 95 is made of a highly conductive metal material. The heat dissipation bridge 95 may be made integrally to the second heat sink 90 or may be combined with the second heat sink 90 after being made as a separate material. A reference numeral 92 refers to a seating end bent from the second heat sink 90 such that the second heat sink 90 is assembled with the circuit board 50.

Referring to FIG. 4, the heat dissipation bridge 95 has a column shape having a polygonal or circular cross section, wherein the end of the heat dissipation bridge 95 protrudes in the direction of the heating element 60 and the opposite end thereof is directly connected to the second heat sink 90. Accordingly, the heat dissipation bridge 95 induces the heat of the heating element 60 to be discharged in a heat conduction method. For the heat conduction, the end of the heat dissipation bridge 95 is preferably in close contact with the heating element 60, but is not required to be in close contact therewith and may be spaced apart by a predetermined distance from the heating element 60.

Accordingly, in the present disclosure, the heat dissipation means 70 cools the heating element 60 by generating the ionic wind, and the heat dissipation bridge 95 directly receives heat generated by the heating element 60 and discharges the heat through the second heat sink 90 to the outside. Accordingly, two means of the heat dissipation means 70 and the heat dissipation bridge 95 can simultaneously cool the heating element 60.

The heat dissipation bridge 95 may be directly in close contact with the heating element 60 or may be in close contact with the shield 65 covering the heating element 60. The heat dissipation bridge 95 may be multiply provided in the second heat sink 90, wherein each of the multiple heat dissipation bridges 95 is arranged at a position corresponding to a position of the heating element 60. In addition, at least a portion 91 of the outer surface of the second heat sink 90 is exposed to an outer side of the upper casing 20, and the heat dissipation bridges 95 are connected to a lower surface of the upper casing, which is an inner surface thereof, so a sufficiently wide heat dissipation area is provided.

The heat dissipation bridge 95 is located in a flow path through which the ionic wind flows. In the embodiment, the heat dissipation bridge 95 is arranged between the inlet H1 and the outlet H2 of the casing C, and the ionic wind flowing from the inlet H1 to the outlet H2 passes the vicinity of the heat dissipation bridge 95. Accordingly, since the heat dissipation bridge 95 protrudes to the flow path through which the ionic wind flows, the heat dissipation bridge 95 may exchange heat with the ionic wind. Accordingly, the surface area of a heating unit (the heating element 60 and the heat dissipation bridge 95) that exchanges heat with the ionic wind is increased, and the convective heat transfer efficiency is improved.

Meanwhile, in the above-described embodiment, the heat dissipation bridge 95 is provided only in the second heat sink 90, but the heat dissipation bridge 95 may be provided even in the first heat sink 15 or even in both the first heat sink 15 and the second heat sink 90. Alternatively, the heat dissipation bridge 95 may not be connected to the first heat sink 15 or the second heat sink 90 but may be directly connected to the casing C, or a portion of the heat dissipation bridge may protrude to the outer side of the casing C.

Looking at a process in which the ionic wind flows with reference to FIG. 4, first, when a high voltage direct current is applied to the wire electrode 75 by the power module 80, the wire electrode 75 becomes the emitter electrode and the counter electrode 77 becomes the collector electrode (the ground electrode), so that the ionic wind is generated. More particularly, ions generated in the wire electrode 75 by corona discharge are moved from the emitter electrode (the wire electrode 75) to the ground electrode (the counter electrode 77) by an electric field between the electrodes, that is, by coulomb force. The ions moving in this manner move air molecules in the same direction (a direction of arrow ① of FIG. 4) via the collision with the air molecules, and the movements of the moving air molecules are joined together and finally generate a blowing force.

Accordingly, in the present disclosure, the wire electrode 75, the counter electrode 77, and the power module 80 constitute the heat dissipation means 70. The heat dissipation means 70 functions to cool the heating element 60 positioned at an inner side of the counter electrode 77 by generating the ionic wind. In the embodiment, the heat dissipation means 70 is installed to be adjacent to the heating element 60 and flows the ionic wind to the inner space S. For reference, the power module 80 may be regarded as a part of the heat dissipation means 70, and may also be regarded as a part of the circuit board 50.

The ionic wind uses the movements of ions occurring during corona discharge. The ions generated by the discharge electrode are moved from the emitter electrode (a discharge electrode) to the collector electrode (the ground electrode) by the electric field between the electrodes, that is, by coulomb force. The ions moving in this manner move air molecules in the same direction via the collision with the air molecules, and the movements of the air molecules are joined together and are finally used as a blowing force.

Accordingly, the heat dissipation means 70 of the present disclosure can be applied to a structure installed in the narrow inner space S and being poor in heat dissipation in which the heating element 60 generating high temperature such as a communication module is provided and the heating element 60 is covered by the shield 65 to block electromagnetic waves.

Meanwhile, the ionic wind exchanges heat with the heating element 60 via convective heat transfer while passing the heating element 60 in the inner space S, and the heat dissipation bridge 95 exchanges heat with the ionic wind since the heat dissipation bridge protrudes to the flow path through which the ionic wind flows. Accordingly, the surface area of a heating unit (the heating element 60 and the heat dissipation bridge 95) that exchanges heat with the ionic wind can be increased, and the convective heat transfer efficiency can be improved. Of course, the heat dissipation bridge 95 may perform cooling function in a method of directly transferring heat (the heat conduction) in a direction of the second heat sink 90 (see arrow ② in FIG. 4) by being in contact with the heating element 60.

The ionic wind having increased temperature after the ionic wind passing the heating element 60 exchanges heat with the heating element 60 is discharged through the outlet H2 of the casing C to the outside (see a direction of arrow ③ of FIG. 4). Since such a process is performed continuously, the heating element 60 can be cooled. Accordingly, the heat dissipation means 70 of the present disclosure cools the heating element 60 of the electronic device by generating the ionic wind, wherein the two means of the heat dissipation means 70 and the heat dissipation bridge 95 simultaneously cool the heating element 60, which increases the cooling efficiency and causes no noise and vibration compared to a cooling fan powered by a motor.

Consequently, looking at the path in which the heat of the heating element 60 and the inner space S is cooled, (i) the heating element 60 and the circuit board 50 exchange heat with the ionic wind introduced into the inner space so as to remove the heat, (ii) after the heat dissipation bridge 95 transfers the heat of the heating element 60 directly to the second heat sink 90, the heat is discharged to the outside such that the heat thereof is cooled, and (iii) the ionic wind introduced into the inner space exchanges heat with a surface of the heat dissipation bridge 95 and is discharged through the outlet H2 to the outside such that the heat thereof is removed.

Next, other embodiments of the present disclosure will be described with reference to FIGS. 6A to 9B. For reference, the description of the same parts as in the above-described embodiment will be omitted.

Figure 6A:
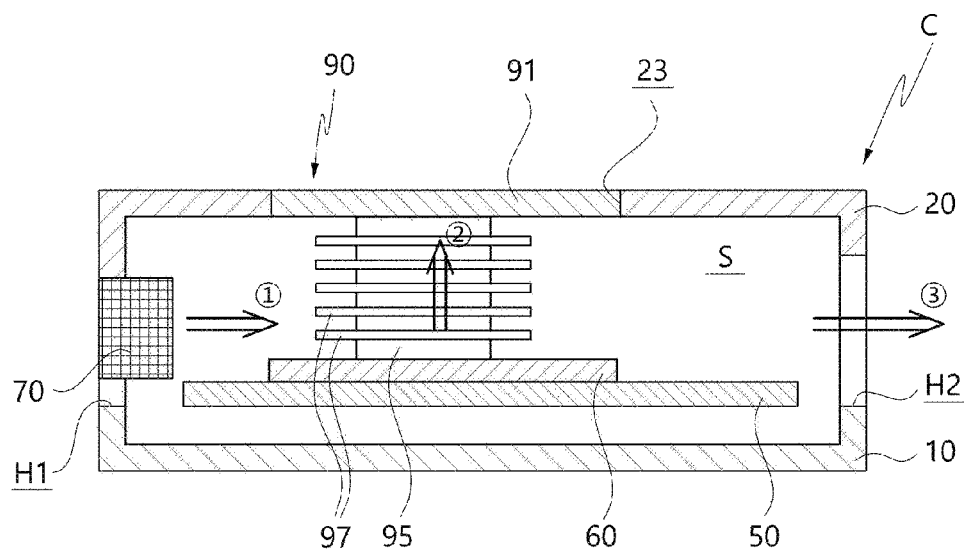
FIGS. 6A and 6B are a sectional view of the electronic device and a perspective view of the structure of the heat dissipation means, respectively, to which a second embodiment of the heat dissipation means constituting the present disclosure is applied.

A sectional view of an internal structure of the electronic device in which the heat dissipation means 70 and the heat dissipation bridge 95 are installed is illustrated in FIG. 6A. The heat dissipation bridge 95 is provided with a heat exchange part. The heat exchange part protrudes from the surface of the heat dissipation bridge 95 and increases the surface area of the heat dissipation bridge 95. The heat exchange part is provided on the surface of the heat dissipation bridge 95, and may be manufactured integrally to the heat dissipation bridge 95 or be assembled with the heat dissipation bridge 95 after being manufactured independently thereof.

Figure 6B:
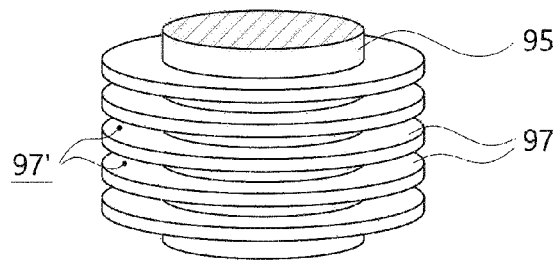

The heat exchange part is a heat dissipation protrusion part surrounding the surface of the heat dissipation bridge 95 and protruding therefrom, and includes heat dissipation plates 97 in a second embodiment. As illustrated in FIG. 6B, each of the heat dissipation plates 97 has a thin ring shape to surround an outer circumferential surface of the heat dissipation bridge 95 of a cylindrical shape. The heat dissipation plate 97 is provided in a direction parallel to a direction (a direction of arrow ① of FIG. 6A) in which the ionic wind flows. Accordingly, the heat dissipation plate does not block the flow of the ionic wind and increases the surface area of heat dissipation bridge which exchanges heat with the ionic wind. In the embodiment, each of the multiple heat dissipation plates 97 is spaced apart from each other and laminated at a different height, so a groove part 97' is provided therebetween.

The heat dissipation plate 97 and the groove part 97' create turbulence in the ionic wind. The high velocity fluctuation of such a turbulence causes the vigorous mixing of fluid, and the mixing of the fluid increases heat and momentum transfer between fluid particles. Furthermore, this increases a frictional force and convective heat transfer rate at the surface of the heat dissipation bridge 95.

Figure 7A:
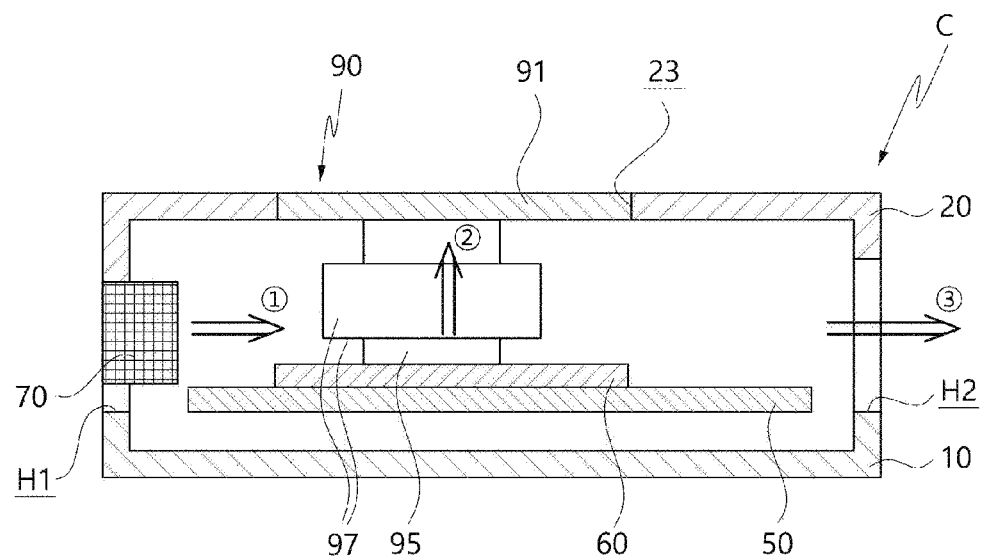
FIGS. 7A and 7B are a sectional view of the electronic device and a perspective view of the structure of the heat dissipation means, respectively, to which a third embodiment of the heat dissipation means constituting the present disclosure is applied.
Figure 7B:
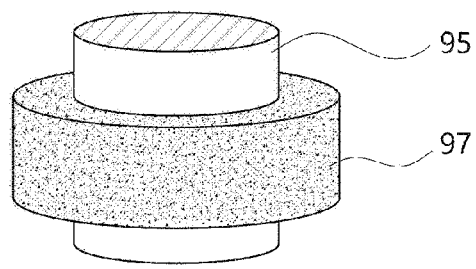

Next, FIGS. 7A and 7B illustrate a third embodiment of the heat dissipation bridge 95. A heat dissipation block 97 is combined with the heat dissipation bridge 95 illustrated in FIGS. 7A and 7B. The heat dissipation block 97 may be regarded as a kind of the heat exchange part and has a cross-sectional area larger than a cross sectional area of the heat dissipation bridge 95. In the embodiment, the heat dissipation block 97 has a cylindrical shape. Alternatively, when the shape of the heat dissipation bridge 95 is a polygonal column shape, the shape of the heat dissipation block 97 may be changed to the shape corresponding thereto.

The heat dissipation block 97 is made of a porous metal foam material. The porous metal foam material as a porous structure corresponds to a foam metal. The heat dissipation block 97 is made of a metal material containing multiple pores, and such a metal foam may have a high specific surface area. Accordingly, the heat dissipation block 97 increases the heat exchange area of the heat dissipation bridge 95 with the ionic wind, thereby increasing the convective heat transfer by the ionic wind and the heat conduction performance by the heat dissipation bridge 95.

The heat dissipation block 97 may be assembled with the heat dissipation bridge 95 after being manufactured independently of the heat dissipation bridge 95, or may be manufactured to be integrated with the heat dissipation bridge 95. Furthermore, although not shown, the entirety of the heat dissipation bridge 95 may be made of a metal foam material.

Figure 8A:
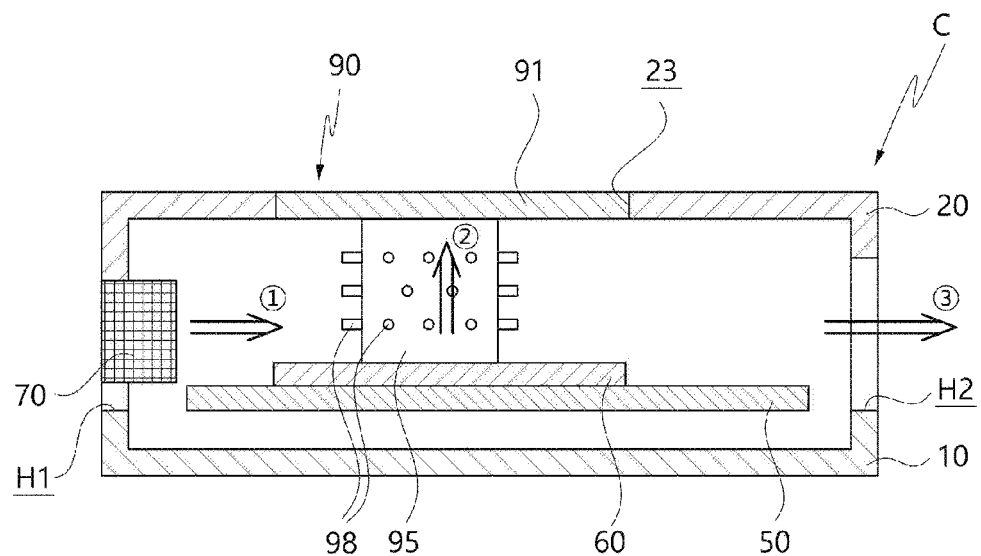
FIGS. 8A and 8B are a sectional view of the electronic device and a perspective view of the structure of the heat dissipation means, respectively, to which a fourth embodiment of the heat dissipation means constituting the present disclosure is applied.
Figure 8B:
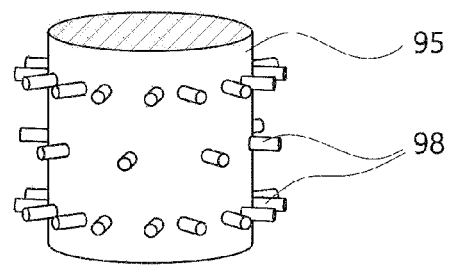

FIGS. 8A and 8B illustrate a fourth embodiment of the heat dissipation bridge 95. The heat exchange part is provided on the surface of the heat dissipation bridge 95 illustrated in FIGS. 8A and 8B, and the heat exchange part is composed of the heat dissipation protrusion part. In the embodiment of the present disclosure, the heat dissipation protrusion part includes heat-dissipating fins 98 protruding from the surface of the heat dissipation bridge 95, wherein the heat-dissipating fins increase the surface area of the heat dissipation bridge 95. The heat-dissipating fins 98, which are provided on the surface of the heat dissipation bridge 95, may be manufactured integrally to the heat dissipation bridge 95 or be assembled therewith after being manufactured independently thereof.

As illustrated in FIG. 8B, each of the plurality of heat-dissipating fins 98 protrudes from the surface of the heat dissipation bridge 95 and has a cylindrical shape in the embodiment, but may also have various shapes. For example, each of the heat-dissipating fins 98 can have various protruding shapes such as a multi-pillar, or a hemispherical or poly-pyramidal shape.

Each of the heat-dissipating fins 98 is not provided in a direction of blocking the flow of the ionic wind, but protrudes in a direction parallel to a direction (a direction of arrow ① of FIG. 8A) in which the ionic wind flows, which increases the surface area of the heat dissipation bridge that exchanges heat with the ionic wind. In the embodiment, each of the multiple heat-dissipating fins 98 is arranged to be spaced apart from each other and to be located at a different height. Such a structure of each of the heat-dissipating fins 98 generates turbulence in the ionic wind.

Figure 9A:
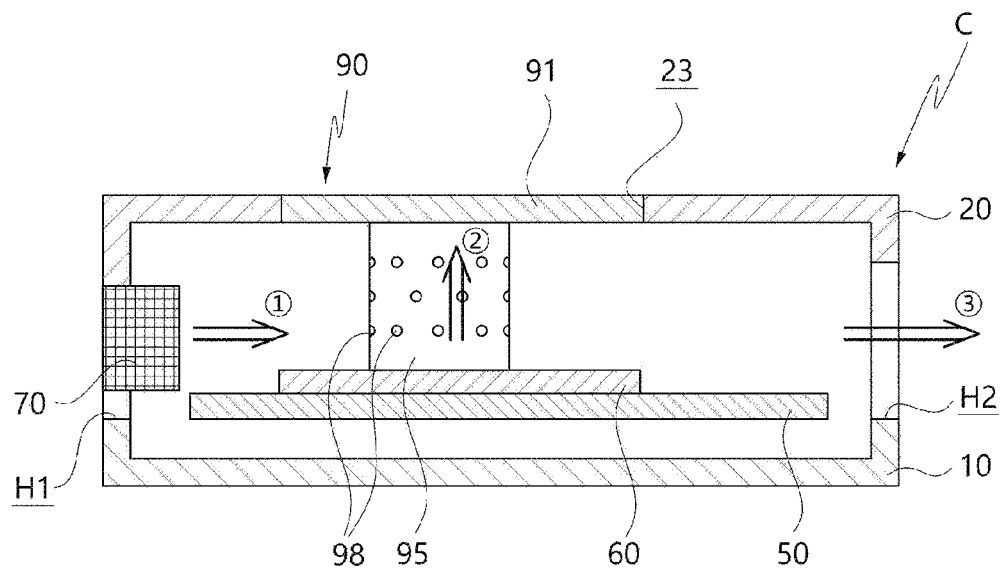
FIGS. 9A and 9B are a sectional view of the electronic device and a perspective view of the structure of the heat dissipation means, respectively, to which a fifth embodiment of the heat dissipation means constituting the present disclosure is applied.
Figure 9B:
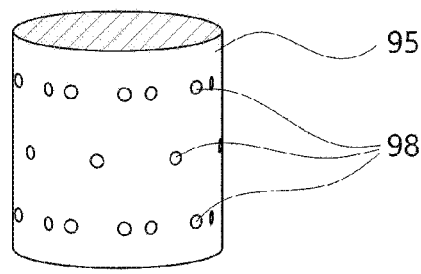

FIGS. 9A and 9B illustrate a fifth embodiment of the heat dissipation bridge 95. A heat dissipation groove 98, which is the heat exchange part, is provided in a surface of the heat dissipation bridge 95. The heat dissipation groove 98 is formed in the surface of the heat dissipation bridge 95 to have a recessed shape and is provided in plural in the embodiment. The recessed shape of each of the heat dissipation grooves 98 increases the entire surface area of the heat dissipation bridge 95 and functions to increase the heat exchange surface area of the heat dissipation bridge with the ionic wind. The heat dissipation groove 98 may be made by forging the heat dissipation bridge 95 of a metal material by using a press.

As illustrated in FIG. 9B, the heat dissipation groove 98 is formed in an approximately circular dimple shape. Alternatively, the heat dissipation groove 98 may be a thin and long groove shape. For example, each of the heat dissipation grooves 98 may have a shape of a slit extending by surrounding the surface of the heat dissipation bridge 95, or may be made in the surface of the heat dissipation bridge 95 to have a recessed depth different from each other. The structure of such a heat dissipation groove 98 may also generate turbulence in the ionic wind.

In the above description, the present disclosure is not necessarily limited to these embodiments, although all elements constituting the embodiments according to the present disclosure are described as being combined or operating in combination. That is, within the scope of the present disclosure, all of the components may be selectively combined to operate in one or more. In addition, the terms "include", "constitute", or "having" described above mean that the corresponding component may be inherent unless otherwise stated. Accordingly, it should be construed that other components may be further included instead of being excluded. All terms, including technical and scientific terms, have the same meaning as commonly understood by ones of ordinary skills in the art to which the present disclosure belongs unless otherwise defined. Commonly used terms, such as those defined in a dictionary, should be construed as consistent with the contextual meaning of the related art and shall not be construed in an ideal or excessively formal sense unless explicitly defined in the present disclosure.

The above description is merely illustrative of the technical idea of the present disclosure, and those skilled in the art to which the present disclosure belongs may make various modifications and changes without departing from the essential characteristics of the present disclosure. Accordingly, the embodiments disclosed in the present disclosure are not intended to limit the technical spirit of the present disclosure, but to describe the present disclosure, and the scope of the technical spirit of the present disclosure is not limited by these embodiments. The scope of protection of the present disclosure should be interpreted by the following claims, and all technical ideas within the scope of the present disclosure should be construed as being included in the scope of the present disclosure.

What is claimed is:

1. An electronic device having a heat dissipation function, the electronic device comprising:
   a heating element provided in an inner space of a casing;
   a heat dissipation means provided in the casing to be adjacent to the heating element and causing an ionic wind to flow to the inner space; and
   a heat dissipation bridge protruding in a direction of the heating element to exchange heat with the ionic wind flowing through the inner space, at least a portion of the heat dissipation bridge being connected to a heat sink to transfer heat received from the heating element to the heat sink,
   wherein the heat dissipation bridge is located on a flow path through which the ionic wind flows, and is erected above the heating element so as to cross the flow path of the ionic wind and,
   wherein the heat sink is provided in the casing such that at least a portion of an outer surface of the heat sink is exposed to an outside of the casing and the heat dissipation bridge is connected to an opposing inner surface of the heat sink.

2. The electronic device of claim 1, wherein a first end of the heat dissipation bridge protrudes in the direction of the heating element and a second end of the heat dissipation bridge at an opposite side of the first end is directly connected to the heat sink.

3. The electronic device of claim 2, wherein the first end of the heat dissipation bridge is in direct contact with a surface of the heating element or with a surface of a shield covering the heating element.

4. The electronic device of claim 3, wherein the heat sink is installed at a heat dissipation window open to the casing.

5. The electronic device of claim 1, wherein the heat dissipation means comprises:
   a power module;
   a wire electrode connected to the power module and configured to receive power from the power module to become an emitter electrode; and
   a counter electrode spaced apart from the wire electrode in a direction closer to the heat dissipation bridge and grounded at a same time of being connected to the power module to become a collector electrode.

6. The electronic device of claim 5, wherein the heat dissipation means comprises a module housing provided in the casing, the module housing having an installation space which is open to opposite sides of the module housing,
wherein the wire electrode is installed at an entrance of the installation space and the counter electrode is installed at an exit of the installation space.

7. The electronic device of claim 5, wherein the power module and one side of the wire electrode are electrically connected to each other, and the counter electrode is installed to be spaced apart from the wire electrode and is configured to be a metal mesh or a metal plate.

8. The electronic device of claim 1, wherein the heat dissipation means is installed at a position adjacent to an inlet open to one side of the inner space, and an outlet is open at a position corresponding to an opposite side of the inlet relative to the heating element in the casing.

9. The electronic device of claim 1, wherein the heat dissipation means is installed in an inlet open to one side of the casing.

10. The electronic device of claim 1, wherein a heat exchange part is provided on a surface of the heat dissipation bridge and increases a surface area of the heat dissipation bridge.

11. The electronic device of claim 10, wherein the heat exchange part has a shape of a ring surrounding the surface of the heat dissipation bridge and protruding therefrom, or has a shape of a protrusion protruding from the surface of the heat dissipation bridge.

12. The electronic device of claim 10, wherein the heat dissipation bridge has a cylindrical shape or a polygonal column shape, and the heat exchange part is a heat dissipation plate structure surrounding the surface of the heat dissipation bridge and protruding therefrom,
wherein the heat exchange part is multiply laminated in upward and downward directions of the heat dissipation bridge and protrudes in a direction orthogonal to a longitudinal direction of the heat dissipation bridge.

13. The electronic device of claim 1, wherein a heat exchange part is provided on a surface of the heat dissipation bridge to have a recessed shape and increases a surface area of the heat dissipation bridge.

14. The electronic device of claim 1, wherein the heat dissipation bridge is made of a porous metal foam material, or the heat dissipation bridge is provided with a heat dissipation block having a cross-sectional area larger than a cross-sectional area of the heat dissipation bridge, wherein the heat dissipation block is made of a porous metal foam material.

* * * * *